(12) United States Patent
Hatano

(10) Patent No.: US 6,392,261 B1
(45) Date of Patent: May 21, 2002

(54) SOLID STATE IMAGING DEVICE AND MANUFACTURING METHOD THEREOF

(75) Inventor: Keisuke Hatano, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/145,342

(22) Filed: Sep. 1, 1998

(30) Foreign Application Priority Data

Sep. 3, 1997 (JP) .............................................. 9-238475

(51) Int. Cl.[7] .............................................. H01L 29/768
(52) U.S. Cl. ........................ 257/229; 257/222; 257/228
(58) Field of Search .................. 257/228, 229, 257/222

(56) References Cited

U.S. PATENT DOCUMENTS 3,863,065 A * 1/1975 Kosonocky .................. 257/222
5,040,038 A * 8/1991 Yutani ......................... 257/229

FOREIGN PATENT DOCUMENTS

JP 7-106543 4/1995

* cited by examiner

*Primary Examiner*—Jerome Jackson, Jr.
(74) *Attorney, Agent, or Firm*—Sughrue Mion PLLC

(57) ABSTRACT

The film thickness of a second oxide film 105 is set to be larger than that of a first gate oxide film 103 in such a way that, when the identical voltage is applied to both of electrodes, the channel potentials under respective electrodes are ±0.2 V or less. The second gate oxide film 105 is formed by the CVD method and the like.

3 Claims, 4 Drawing Sheets

SOLID STATE IMAGING DEVICE AND MANUFACTURING METHOD THEREOF

BACKGROUND OF THE INVENTION

1. Field of the Invention

The present invention relates to a solid state imaging device and a method of manufacturing thereof.

2. Description of the Related Art

Referring to FIG. 3, a conventional method of manufacturing a solid state imaging device is described. As shown in FIG. 3(a), upon a p-type silicon substrate 301, an n-type well layer 302 for the vertical charge coupled device (CCD) is formed, by the ion implantation technique using the n-type dopant. Next, a first gate oxide film 303 is formed, by the high temperature thermal oxidation method, at a temperature above 900° C. and thereafter a polysilicon film is deposited, by the chemical vapour deposit (CVD) method, to a thickness of 400 nm, following which a patterning of this polysilicon film is performed and thereby a first charge transfer electrode 304 is formed.

Next, as shown in FIG. 3(b), a second gate oxide film 305 with a thickness of 60–100 nm is formed on the first gate oxide film 303 by the thermal oxidation, carried out at a high temperature above 900° C. During this, the surface of the first charge transfer electrode 304 is also subject to the thermal oxidation, which results in the formation of an oxide film 306 on the top of the first charge transfer electrode 304. Consequently, in this manufacturing method, the edges of the first charge transfer electrode 304 are lifted up at the time of formation of the second gate oxide film 305.

After this, as shown in FIG. 3(c), patterns of a second charge transfer electrode 307 of polysilicon are formed. In the present conventional example, the edges of the first charge transfer electrode 304 become overhanged so that an etching tends to leave remains in this part, at the time of formation of the second charge transfer electrode, and, as a result, it is apt to short-circuit between patterns of the second charge transfer electrode 307. Moreover, lifting the first charge transfer electrode 304 makes the gap of the levels on the surface more significant, which leads to a problem of poor coverage of a light-shielding film that is to be formed in a later step.

FIG. 4 is schematic sectional views illustrating, in sequence, another conventional method of manufacturing a solid state imaging device which solves the above problems, wherein a second gate insulating film is formed by the CVD method.

First, as shown in FIG. 4(a), an n-type well layer 402 in a signal charge transfer section is formed on the surface of a p-type silicon substrate 401 by the ion implantation technique using the n-type dopant. Next, a first gate oxide film 403 is formed, by the high temperature thermal oxidation method at a temperature above 900° C., and thereafter a polysilicon film is deposited, by the CVD method, to a thickness of 400 nm, following which a patterning of this polysilicon film is performed and thereby a first charge transfer electrode 404 is formed.

Next, after the first gate oxide film is removed by wet etching, using hydrofluoric acid solution as an etchant and the first charge transfer electrode 404 as a mask, a second gate oxide film 405 and an oxide film 406 are formed by the CVD method, as shown in FIG. 4(b).

Next, as shown in FIG. 4(c), after a second polysilicon film is deposited to a thickness of approximately 100–250 nm by the CVD method, this second polysilicon film is patterned to a prescribed shape by selective etching and thereby a second charge transfer electrode 407 is formed.

However, in this conventional method of manufacturing the charge transfer device, when the second gate oxide film is formed by removing the exposed first gate insulating film, making use of the first charge transfer electrode as a mask, an outdiffusion of phosphorus may take place in the n-type well layer which is to become a channel region of the signal charge transfer section. Because of this, a region beneath the first charge transfer electrode and a region beneath the second charge transfer electrode may show different channel potential characteristics, which is a clear drawback.

SUMMARY OF THE INVENTION

An object of the present invention is to provide a solid state imaging device, wherein:

when the identical voltage is applied to both of electrodes, the first charge transfer electrode and the second charge transfer electrode, the level of channel potentials under respective electrodes are the same;

a displacement of the potential under the second charge transfer electrode is sufficiently secured; and thereby the amount of the maximum transfer charge in the vertical CCD is improved.

In accordance with an aspect of the present invention that solves the above problems, there is provided a method of manufacturing a solid state imaging device, which comprises steps of:

forming a semiconductor region of the second conductive-type as a charge transfer section upon a semiconductor substrate of the first conductive-type;

forming a first gate insulating film on the entire surface and thereafter forming a first polysilicon film, which is, then, patterned to form a first charge transfer electrode;

removing, wholly or partially, the exposed part of said first gate insulating film and thereafter forming a second gate insulating film on the entire surface; and forming, upon said second gate insulating film, a second polysilicon film, which is then patterned to form a second charge transfer electrode; wherein:

the film thickness of said second gate insulating film is larger than that of said first gate insulating film;

the film thickness of said first gate insulating film and said second gate insulating film are set in such a way that the channel potential under said first charge transfer electrode and the channel potential under said second charge transfer electrode are approximately identical, when the identical voltage is applied to both of said first charge transfer electrode and said second charge transfer electrode.

The above and further objects and novel features of the invention will more fully appear from the following detailed description when the same is read in connection with the accompanying drawings. It is to be expressly understood, however, that the drawings are for purpose of illustration only and are not intended as a definition of the limits of the invention.

DETAILED DESCRIPTION OF THE PREFERRED EMBODIMENTS

Figure 1A:
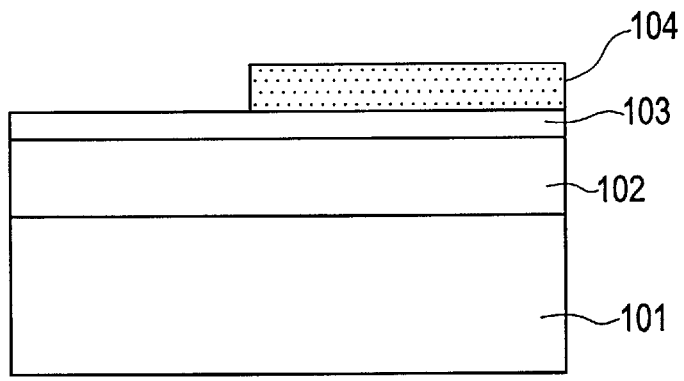
FIG. 1 is schematic sectional views illustrating, in sequence, a manufacturing process of a charge transfer device in accordance with a first preferred embodiment of the present invention.

Referring to FIG. 1, a first embodiment of the present invention is described. First, as shown in FIG. 1(a), upon a p-type silicon substrate with a doping density of $1\times10^{16}$ cm$^{-1}$, an n-type well layer 102 for the vertical CCD is formed, by the ion implantation technique using the n-type dopant, to a doping density of $1\times10^{17}$ cm$^{-1}$. Next, a first gate oxide film 103 is formed to a thickness of 60 nm, by the high temperature thermal oxidation method, at a temperature above 900° C., and thereafter a polysilicon film is deposited, by the CVD method, to a thickness of 400 nm, following which a patterning of this film is performed and thereby a first charge transfer electrode 104 is formed.

Figure 1B:
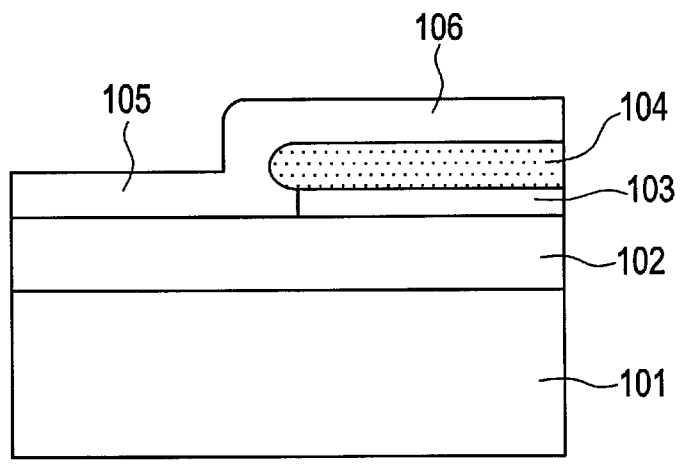

Next, as shown in FIG. 1(b), a second gate oxide film 105 with a thickness of 80 nm is formed on the first gate oxide film 103 by the thermal oxidation, carried out at a high temperature above 900° C. During this, the surface of the first charge transfer electrode 104 is also subject to the thermal oxidation, which results in the formation of an oxide film 106 on the surface of the first charge transfer electrode 104.

Figure 1C:
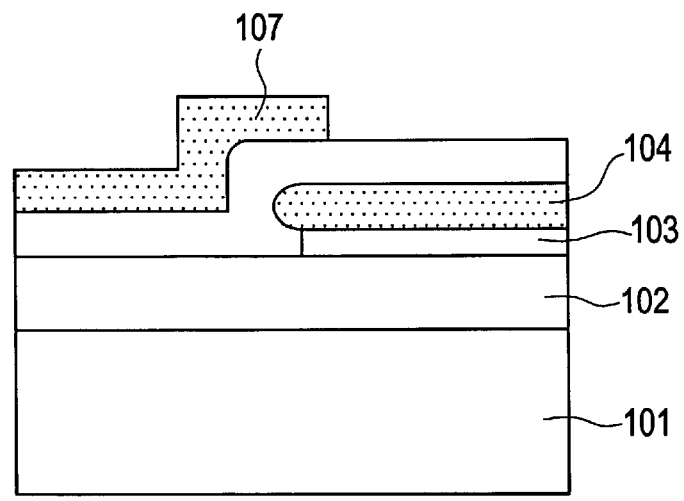

Next, as shown in FIG. 1(c), patterns of a second charge transfer electrode 107 of polysilicon are formed.

In this embodiment, the film thickness of the second gate oxide film 105 is set to be larger than that of the first gate oxide film 103 in such a way that the level of channel potentials formed under these films become the same. That is, in forming the second gate oxide film 105, the doping density in the n-type well layer 102 is lowered by an outdiffusion of the dopant so that the channel potential under the second charge transfer electrode 107 falls more than the channel potential under the first charge transfer electrode 104, wherein this fall is compensated by making the second gate oxide film 105 thicker so as to make the channel potentials under these electrodes approximately identical. In this way, a displacement of the potential, even under the second charge transfer electrode, may be secured and thereby the amount of the maximum transfer charge in the vertical CCD is improved.

In the present invention, although the level of the channel potentials under the first charge transfer electrode and the second charge transfer electrode may not be completely identical, it is preferable that the difference between those channel potentials is equal to ±0.2 V or less when 0 V in voltage is applied to respective electrodes. This is because white non-uniformity in the screen is, in case of ±0.2 V or less, indiscernible to the naked eyes. Further, the difference in film thickness between the second gate oxide film 105 and the first gate oxide film 103 may be set accordingly, depending on the doping densities and the like. In the present embodiment, the difference in film thickness is set to be 20 nm, which makes the difference in channel potentials, at the time of applied voltage of 0 V, equal to ±0.2 V or less.

Next, referring to FIG. 2, another embodiment of the present invention is described.

Figure 2A:
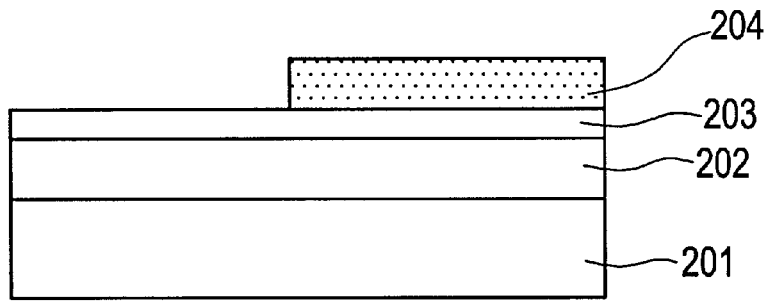
FIG. 2 is schematic sectional views illustrating, in sequence, a manufacturing process of a charge transfer device in accordance with a second preferred embodiment of the present invention.

First, as shown in FIG. 2(a), an n-type well layer 202 is formed as a signal charge transfer section on the surface of a p-type silicon substrate 201 by the ion implantation technique using the n-type dopant. Next, a first gate oxide film 203 is formed, by the high temperature thermal oxidation method at a temperature above 900° C., and thereafter a polysilicon film is deposited, by the CVD method, to a thickness of 400 nm, following which a patterning of this polysilicon film is performed and thereby a first charge transfer electrode 204 is formed.

Figure 2B:
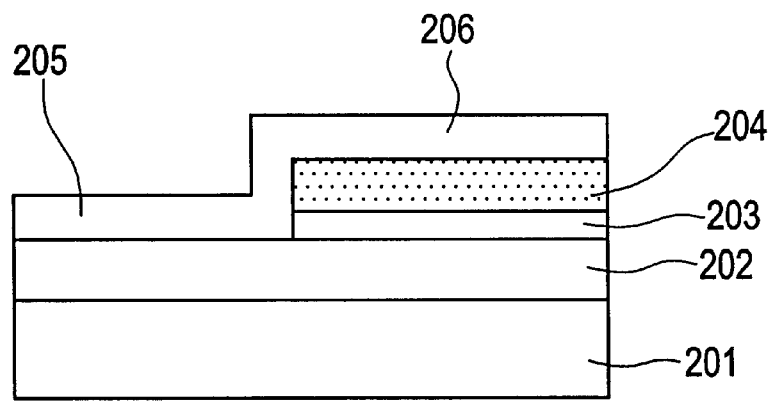
Figure 2C:
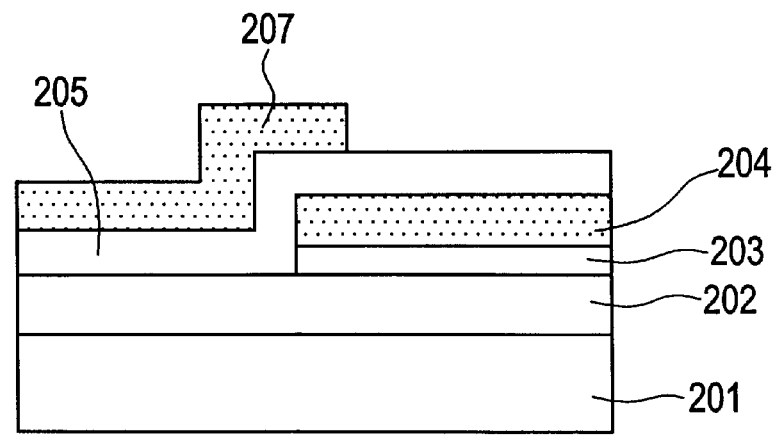
Figure 3A:
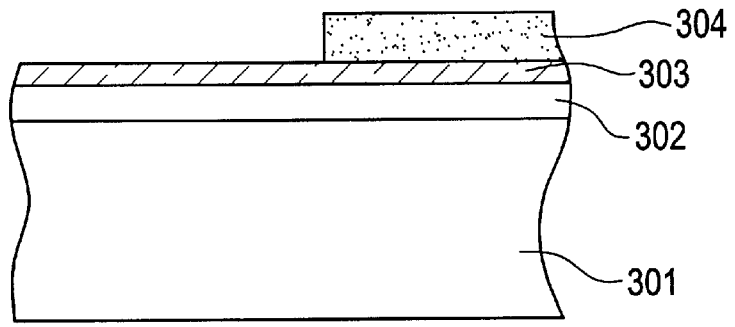
FIG. 3 is schematic sectional views illustrating, in sequence, a conventional manufacturing method of a charge transfer device.
Figure 3B:
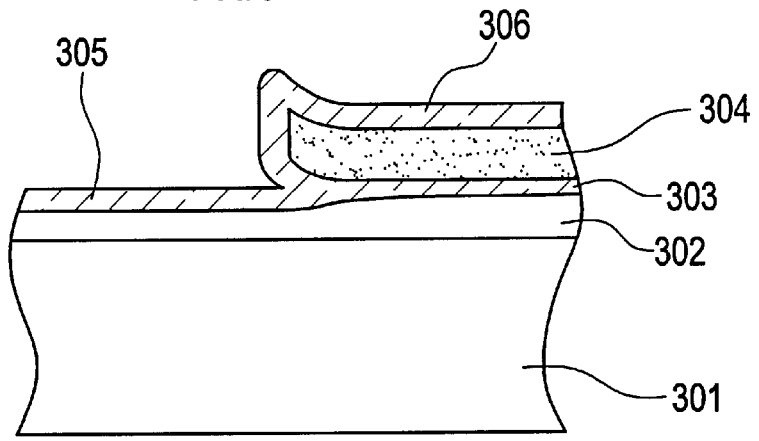
Figure 3C:
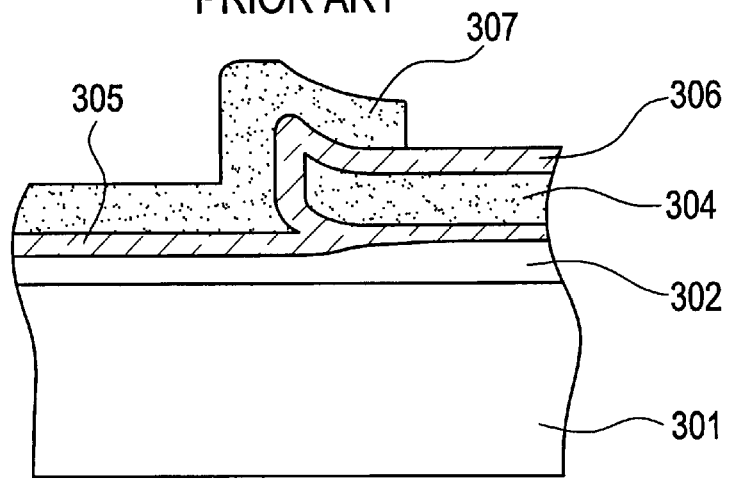
Figure 4A:
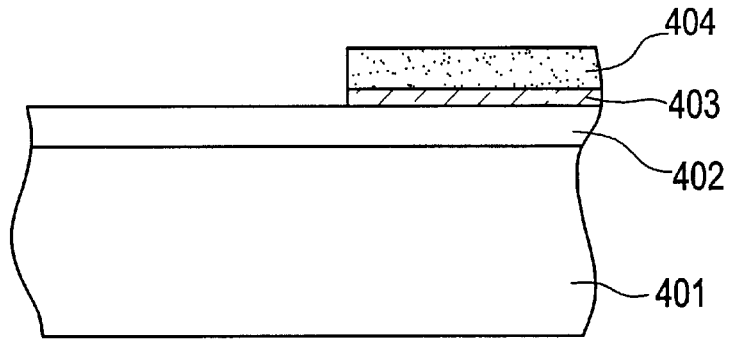
FIG. 4 is schematic sectional views illustrating, in sequence, another conventional manufacturing method of a charge transfer device.
Figure 4B:
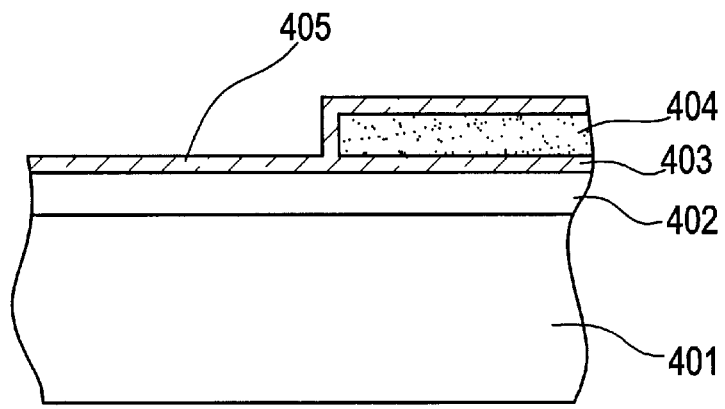
Figure 4C:
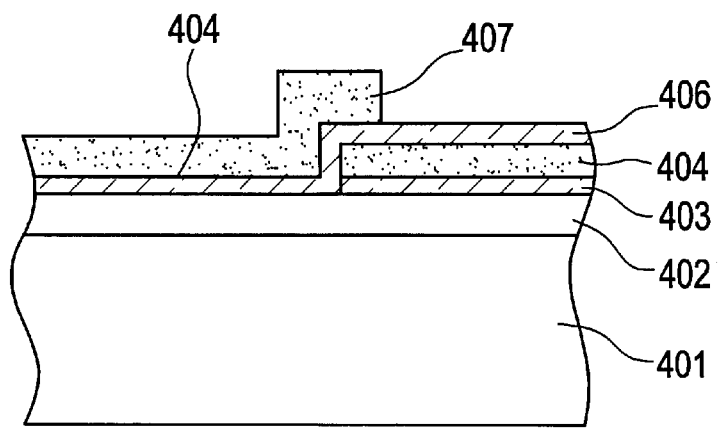

Next, as shown in FIG. 2(b), the first gate oxide film is removed by wet etching, using hydrofluoric acid solution as an etchant and the first charge transfer electrode 204 as a mask. Then, a second gate oxide film 205 and an oxide film 206 are formed, through reactions between SiH$_4$ and H$_2$O gas in the CVD method, to a thickness of 70 nm. Next, as shown in FIG. 2(c), after a second polysilicon film is deposited to a thickness of approximately 100–250 nm by the CVD method, this second polysilicon film is patterned to a prescribed shape by selective etching and thereby a second charge transfer electrode 207 is formed.

In this embodiment, the second gate oxide film is formed by the CVD method. Growing temperature for films in the CVD method is approximately 800° C. and as much as 100° C. lower than the temperature of 900° C. at which the thermal oxidation is carried out, and besides the outdiffusion of the dopant in the n-type well layer takes place only during the initial stage of the film formation so that the film thickness of the second gate oxide film can be smaller, compared with the case using the thermal oxidation method, and, furthermore, the film thickness of the oxide film formed on the top of the first charge transfer electrode becomes smaller, improving the degree of coverage of the superficial steps by a light shielding film which shields the upper section of electrodes from light through an interfacial insulating film and thereby may reduce smear.

Further, in the present embodiment, with the second gate oxide film being formed by the CVD method, the film thickness of a structural transition layer in a silicon-oxide film interface is small, compared with the case using the thermal oxidation method. Therefore it is harder for dangling bonds of silicon (unbinding sites of Si) to be formed and, as a result, the dark current output under the second charge transfer electrode can be reduced.

While the first gate insulating film is formed by the thermal oxidation method in the embodiments described above, an oxide film formed by the CVD method can achieve the object of the present invention, as well, and may be chosen without departing from the spirit and the scope of the invention.

As described above, in the present invention, the film thickness of the second gate insulating film is set to be larger than that of the first gate insulating film so that, when the identical voltage is applied to both of the first charge transfer electrode and the second charge transfer electrode, the channel potentials formed under these electrodes are approximately identical, which enables to take a displacement of the potential even under the second charge transfer electrode, and thereby may improve the amount of the maximum transfer charge in the vertical CCD.

What is claimed is:

1. A solid state imaging device, comprising:
   a semiconductor substrate of a first conductivity type;
   a semiconductor region of a second conductivity type disposed in the semiconductor substrate;
   a first charge transfer electrode formed on a portion of the semiconductor region;
   a first gate insulating film disposed between the semiconductor region and the first charge transfer electrode;

a second gate insulating film disposed on a portion of the semiconductor region as well as on the first charge transfer electrode; and a second charge transfer electrode formed on a portion of the second gate insulating film, wherein a film thickness of the second gate insulating film is larger than a film thickness of the first gate insulating film.

2. A solid state imaging device as recited in claim 1, wherein the thickness of the gate insulating films are set such that the channel potential under the first charge transfer electrode and the channel potential under the second charge transfer electrode are approximately the same, when an identical voltage is applied to both of the charge transfer electrodes.

3. A solid state imaging device as recited in claim 1, wherein the thickness of the gate insulating films are set such that the difference between the channel potential under the first charge transfer electrode and the channel potential under the second charge transfer electrode is equal to ±0.2 V or less, when 0 V in voltage is applied to both of the charge transfer electrodes.

* * * * *